(12) United States Patent
Liu et al.

(10) Patent No.: US 10,838,273 B2
(45) Date of Patent: Nov. 17, 2020

(54) ARRAY SUBSTRATE, REPAIR METHOD THEREOF, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Meng Liu, Beijing (CN); Shuo Tang, Beijing (CN); Peng Sun, Beijing (CN); Bin Feng, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 16/097,895

(22) PCT Filed: Feb. 22, 2018

(86) PCT No.: PCT/CN2018/076962
§ 371 (c)(1),
(2) Date: Oct. 31, 2018

(87) PCT Pub. No.: WO2018/188417
PCT Pub. Date: Oct. 18, 2018

(65) Prior Publication Data
US 2019/0146291 A1    May 16, 2019

(30) Foreign Application Priority Data
Apr. 11, 2017  (CN) .......................... 2017 1 0233921

(51) Int. Cl.
*H01L 27/14*   (2006.01)
*G02F 1/1362*  (2006.01)
*H01L 27/12*   (2006.01)

(52) U.S. Cl.
CPC ...... *G02F 1/136259* (2013.01); *H01L 27/124* (2013.01); *G02F 2001/136263* (2013.01)

(58) Field of Classification Search
CPC ............. H01L 29/786; H01L 29/78606; H01L 29/7869; H01L 29/78633; H01L 29/78696
See application file for complete search history.

(56) References Cited

U.S. PATENT DOCUMENTS

2007/0008445 A1* 1/2007 Hur ..................... H01L 27/1214
349/43
2009/0033823 A1   2/2009 Chung et al.
(Continued)

FOREIGN PATENT DOCUMENTS

CN    101122695 A    2/2008
CN    101446724 A    6/2009
(Continued)

OTHER PUBLICATIONS

Search Report and Written Opinion for International Application No. PCT/CN2018/076962 dated May 29, 2018.

*Primary Examiner* — Phuc T Dang
(74) *Attorney, Agent, or Firm* — Calfee, Halter & Griswol LLP (57) ABSTRACT

An array substrate, a repair method thereof, and a display device are disclosed. The array substrate includes: a substrate including a first electrode and a second electrode, wherein the first electrode and the second electrode are located in different layers, and a projection of the first electrode on the substrate does not overlap a projection of the second electrode on the substrate; a first conductive layer electrically connecting the first electrode and the second electrode through vias; and a repairing component configured to electrically connect the first electrode and the second
(Continued)

electrode when an electrical connection between the first electrode and the second electrode fails.

20 Claims, 3 Drawing Sheets

(56) References Cited

U.S. PATENT DOCUMENTS

| | | | |
|---|---|---|---|
| 2010/0163880 | A1 | 7/2010 | Jeon |
| 2017/0278977 | A1* | 9/2017 | Jeong ................ H01L 29/78606 |
| 2018/0212061 | A1* | 7/2018 | Xie ................... H01L 29/78648 |

FOREIGN PATENT DOCUMENTS

| | | |
|---|---|---|
| CN | 102650784 A | 8/2012 |
| CN | 202939398 U | 5/2013 |
| CN | 106842751 A | 6/2017 |

* cited by examiner

ARRAY SUBSTRATE, REPAIR METHOD THEREOF, AND DISPLAY DEVICE

RELATED APPLICATIONS

The present application is the U.S. national phase entry of PCT/CN2018/076962, with an international filing date of Feb. 22, 2018, which claims the benefit of Chinese Patent Application No. 201710233921.6, filed on Apr. 11, 2017, the entire disclosures of which are incorporated herein by reference.

TECHNICAL FIELD

The present disclosure relates to the field of liquid crystal display technologies, and particularly to an array substrate, a repair method thereof, and a display device.

BACKGROUND

High-resolution and high-pixel-density liquid crystal display devices have become the mainstream in the current liquid crystal display industry. Under the design requirements of high-resolution liquid crystal display devices, structural space of peripheral circuits of an array substrate is often limited. Especially for small-sized liquid crystal display devices, structural space size of peripheral circuits is more limited. Therefore, the lead region of the peripheral circuits of the array substrate can only adopt a method in which data line leads and source or drain electrodes are arranged alternately to meet the process requirements, so that the data line leads and the source or drain electrodes can only be connected through vias.

SUMMARY

Embodiments of the present disclosure provide an array substrate, comprising:
a substrate comprising a first electrode and a second electrode, wherein the first electrode and the second electrode are located in different layers, and a projection of the first electrode on the substrate does not overlap a projection of the second electrode on the substrate;
a first conductive layer electrically connecting the first electrode and the second electrode through vias; and
a repairing component configured to electrically connect the first electrode and the second electrode when an electrical connection between the first electrode and the second electrode fails.

In one or more embodiments, the repairing component is a first electrode extension formed by extending from the first electrode, the first electrode extension is insulated from the second electrode, and a projection of the first electrode extension on the substrate overlaps the projection of the second electrode on the substrate.

In one or more embodiments, the repairing component is a conductive portion electrically connected to the second electrode, the conductive portion is insulated from the first electrode, and a projection of the conductive portion on the substrate overlaps the projection of the first electrode on the substrate.

In one or more embodiments, the substrate comprises a lead region and a pixel region, the first electrode is located in the lead region, and the second electrode is located in the pixel region.

In one or more embodiments, the pixel region is provided with a plurality of thin film transistors and a plurality of data lines, the lead region is provided with a plurality of data line leads, and the plurality of data lines are electrically connected with the plurality of data line leads in one-to-one correspondence. The data lines are arranged in a same layer as gate electrodes of the thin film transistors, the first electrode is the plurality of data line leads, and the second electrode is source or drain electrodes of the thin film transistors. The repairing component is electrically connected to one of the data line lead and the source or drain electrode and at least partially overlaps the other of the data line lead and the source or drain electrode in an insulated manner.

In one or more embodiments, the repairing component is a data line lead extension which protrudes from the data line lead toward the source or drain electrode, the data line lead extension extends to the pixel region and at least partially overlaps the source or drain electrode in an insulated manner.

In one or more embodiments, the projection of the source or drain electrode on the substrate falls within the projection of the data line lead extension on the substrate.

In one or more embodiments, the array substrate further comprises a second conductive layer located in the pixel region. The second conductive layer is disposed between a layer where the source or drain electrode of the thin film transistor is located and a layer where the gate electrode is located in a direction perpendicular to the substrate. The second conductive layer is electrically connected to the source or drain electrode and insulated from the data line lead.

In one or more embodiments, the repairing component is a conductive portion which is arranged in a same layer as the second conductive layer, and the conductive portion is directly electrically connected to the source or drain electrode.

In one or more embodiments, the conductive portion is insulated from the second conductive layer, extends from the pixel region to the lead region, and at least partially overlaps the data line lead in an insulated manner.

In one or more embodiments, the projection of the source or drain electrode on the substrate falls within the projection of the conductive portion on the substrate.

For example, the array substrate further comprises a first insulating layer. The first insulating layer is disposed between the data line lead and the source or drain electrode. A first via is disposed in the first insulating layer. The first conductive layer is electrically connected to the data line lead through the first via.

In one or more embodiments, the array substrate further comprises a second insulating layer. The second insulating layer is disposed between the first conductive layer and the source or drain electrode. A second via is disposed in the second insulating layer. The first conductive layer is electrically connected to the source or drain electrode through the second via.

In one or more embodiments, the first via runs through the first insulating layer and the second insulating layer.

In one or more embodiments, the data lines and data line leads are formed of a metal.

One or more embodiments provide a display device comprising the array substrate described above.

One or more embodiments of the present disclosure provide a method of repairing the array substrate described above, comprising electrically connecting the first electrode and the second electrode with a repairing component when the electrical connection between the first electrode and the second electrode fails.

In one or more embodiments, the method comprises electrically connecting the repairing component to one of the first electrode and the second electrode by laser welding.

DETAILED DESCRIPTION OF EMBODIMENTS

Generally, in a via connection method of the array substrate, the data line leads and the source or drain electrode are connected by means of a second layer of indium tin oxide. Since the second layer of indium tin oxide film has a thickness about 600 Å, it is relatively thin and exposed on the surface of the array substrate. In addition, there is a difference in height between the data line lead and the source or drain electrode. Thus, electrostatic discharge is prone to occur during the production process, causing an open circuit between the data line lead and the source or drain electrode. At present, in the via connection method of the array substrate, no remedial structure is provided for this, so that the array substrate cannot be repaired after this problem occurs, thereby reducing the production yield of the array substrate.

Hereinafter, the array substrate and the repairing method thereof, the structure and working principle of the display device, and the like of the embodiments of the present disclosure will be further illustrated with reference to the accompanying drawings.

Reference numerals: 1, substrate; 2, gate electrode; 3, data line; 3W, data line lead; 4, data line lead extension; 5, first insulating layer; 6, active layer; 7, source or drain electrode; 8, second insulating layer; 81, first via; 82, second via; 9, first conductive layer; 10, second conductive layer; 11, conductive portion; PA, pixel region; WA, lead region.

The array substrate of the embodiments of the present disclosure is applicable to all array substrates with data line leads and source or drain electrodes that are alternately disposed and connected in a via connection manner.

Figure 1:
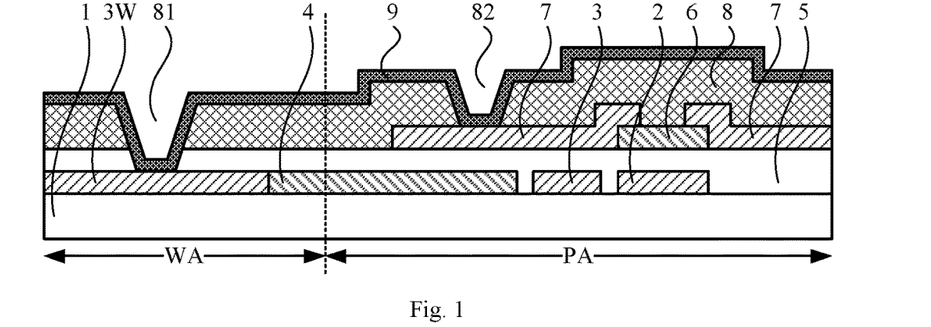
FIG. 1 is a structural diagram of an array substrate according to an embodiment of the present disclosure.

In the embodiments of the present disclosure, reference is made to a case in which an array substrate comprising data line leads and source or drain electrodes which are alternately disposed in the lead region and the pixel region respectively and connected in a via connection manner. As shown in FIG. 1, the array substrate comprises a substrate 1. For example, the substrate 1 is made from glass, and is divided into a lead region WA and a pixel region PA. The pixel region PA of the substrate 1 is provided with a plurality of thin film transistors and a plurality of data lines 3. Each thin film transistor comprises a gate electrode 2, an active layer 6, a source or drain electrode 7, and the like. The lead region WA of the substrate 1 is provided with a plurality of data line leads 3W, which are arranged in a same layer as the gate electrode of the thin film transistor, and are respectively used to connect to the source or drain electrode 7 of each corresponding thin film transistor to output its data signal. As is known to those skilled in the art, when a data line extends to an area outside the pixel region, such as a peripheral area of the lead region in the embodiment of the present disclosure, the data line is referred to as a data line lead. That is to say, the data line and the data line lead are usually of an integral structure, i.e., formed by a same film forming process and a same patterning process. However, embodiments of the present disclosure are not limited thereto, and the data line lead may be formed separately from the data line, as long as the data line leads are electrically connected to the data line.

In the embodiments of the present disclosure, the data line and the data line lead formed of a metal material are described as an example. However, those skilled in the art will appreciate that the data line and data line lead can be made from a metal element or alloy. The data line and data line lead can also be formed of other conductive materials such as conductive oxides. In addition, the data line and the data line lead may comprise a single layer, a double layer or a multilayer structure.

It should be noted that the expression "the data line (or the data line lead) and the gate electrode are arranged in a same layer" herein means that the data line (or the data line lead) and the gate electrode are formed by a same film forming process and a same patterning process. Structurally, the data line (or the data line lead) and the gate electrode are in a same stack level in the layers of the array substrate. It should be noted that the data line (or the data line lead) and the gate electrode that are arranged in a same layer are not necessarily at a same distance from the substrate.

In the present embodiment, the data line lead 3W is located in the lead region WA, and the data line 3 and the source or drain electrode 7 are located in the pixel region PA. The material of the first insulating layer 5 is a non-metal, e.g. silicon nitride. The first insulating layer 5 is disposed between a layer where the data line lead 3W is located and a layer where the source or drain electrode 7 is located. The first insulating layer 5 protects the data line lead 3W and disables direct contact between the data line lead 3W and the source or drain electrode 7 which otherwise would form an electrically conductive connection. Due to the arrangement of the first insulating layer 5, there is a difference in height between the source or drain electrode 7 and the data line lead 3W.

The first conductive layer 9 serves as a common electrode and is made from indium tin oxide. The first conductive layer 9 may be sized to cover any one of the data line leads 3W and the source or drain electrode 7 of the thin film transistor corresponding to the data line lead 3W.

The material of the second insulating layer 8 is a non-metal, e.g. silicon nitride. The second insulating layer 8 is disposed between a layer where the first conductive layer 9 is located and the layer where the source or drain electrode 7 is located to protect the source or drain electrode 7. In an embodiment, as shown in FIG. 1, the second insulating layer 8 completely covers the first insulating layer 5. In another embodiment, the second insulating layer 8 covers only a portion of the first insulating layer 5.

Due to the arrangement of the first insulating layer 5, the layer where the data line lead 3W is located is insulated from the layer where the source or drain electrode 7 is located. Therefore, in order to realize the electrical connection between the data line lead 3W and the source or drain electrode 7, a deep first via 81 is disposed on the first insulating layer 5, and a shallow second via 82 is disposed on the second insulating layer 8. The first conductive layer 9 is electrically connected to the data line lead 3W through the first via 81 and electrically connected to the source or drain electrode 7 through the second via 82. Thereby, the first conductive layer 9 realizes the connection between the data line lead 3W and the source or drain electrode 7 through the via, so that a conduction path is formed between the data line lead 3W and the source or drain electrode 7.

It should be noted that, in the structure shown in the drawing, in order to ensure that the first conductive layer 9 can be connected to the data line lead 3W, the first via 81 passes through both the first insulating layer 5 and the second insulating layer 8. When the second insulating layer 8 covers only a portion of the first insulating layer 5, and the first via 81 is formed in a region of the first insulating layer 5 that is not covered by the second insulating layer 8, the first via 81 only needs to pass through the first insulating layer 5. In the context of the present disclosure, "deep" and "shallow" are only relative results obtained by comparing the depth of the first via 81 with the depth of the second via 82.

Since there is a difference in height between the source or drain electrode 7 and the data line lead 3W, when the data line lead 3W and the source or drain electrode 7 are electrically connected only by the first conductive layer 9, electrostatic discharge is prone to occur in the production process, and the first conductive layer 9 between the data line lead 3W and the source or drain electrode 7 is further burned out. As a result, an open circuit occurs between the data line lead 3W and the source or drain electrode 7, and effective repair cannot be performed in this case. Therefore, in the present disclosure, a repairing component is disposed between the data line lead 3W and the source or drain electrode 7. The repairing component comprises, for example, a conductive material. The repairing component is electrically connected to the data line lead 3W and overlaps at least a portion of the source or drain electrode 7. Even if electrostatic discharge occurs in the production process and thus an open circuit occurs between the data line lead 3W and the source or drain electrode 7, the repairing component may be used for repair, so that a conduction path is formed between the data line lead 3W and the source or drain electrode 7. This improves the production yield of the array substrate and may be applied to all array substrates using the alternate wiring method.

As shown in FIG. 1, in the present embodiment, the repairing component is arranged, for example, in a same layer as the data line lead 3W. For example, the repairing component is a data line lead extension 4 which protrudes from the data line lead 3W toward the source or drain electrode 7, that is, the two are an integral structure. Therefore, the material of the repairing component is the material of the data line lead 3W. The data line lead extension 4 extends from the lead region to the pixel region and at least partially overlaps the source or drain electrode 7 in an insulated manner. In the context of embodiments of the present disclosure, "the data line lead extension at least partially overlaps the source or drain electrode" refers to that "the orthographic projection of the data line lead extension on the substrate at least partially overlaps the orthographic projection of the source or drain electrode on the substrate." In an example, the orthographic projection of the data line lead extension on the substrate overlaps the orthographic projection of the source or drain electrode on the substrate partially. In another example, the orthographic projection of the source or drain electrode on the substrate falls within the orthographic projection of the data line lead extension on the substrate. The size of the overlapping portion can be specifically determined according to actual needs or cost, as long as the electrical connection between the data line lead extension 4 and the source or drain electrode 7 can be realized by laser welding and the data line lead 3W is electrically connected with the source/drain electrode 7.

FIGS. 2A-2E are schematic cross-sectional views of the array substrate of the present embodiment in specific preparation steps. For example, the method of fabricating the array substrate comprises the following steps.

Figure 2A:
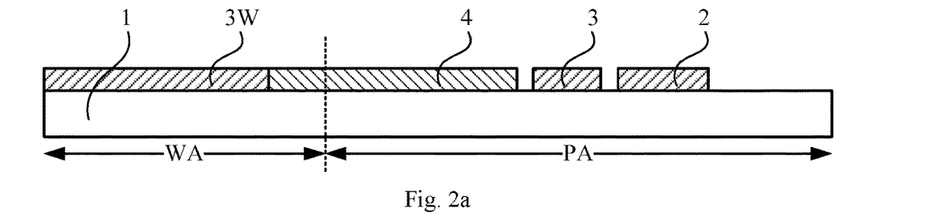
FIG. 2A is a structural diagram of the array substrate of the embodiment shown in FIG. 1 at a stage during fabrication.

As shown in FIG. 2A, a gate electrode 2, a data line lead 3W, and a data line lead extension 4 are formed on the substrate 1, so that the data line lead extension 4 extends from the lead region of the substrate 1 to the pixel region.

Figure 2B:
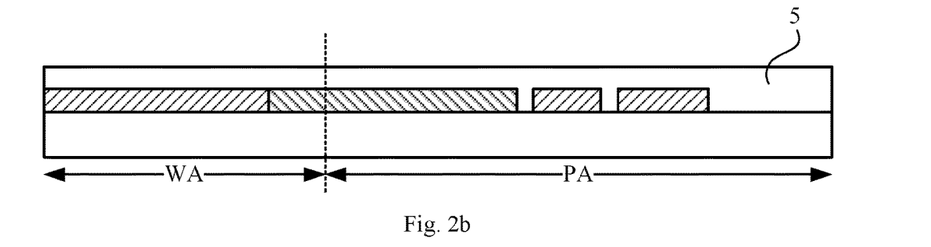
FIG. 2B is a structural diagram of the array substrate of the embodiment shown in FIG. 1 at a stage during fabrication.

As shown in FIG. 2B, a first insulating layer 5 is formed on the substrate 1 on which the gate electrode 2, the data line lead 3W, and the data line lead extension 4 have been formed.

Figure 2C:
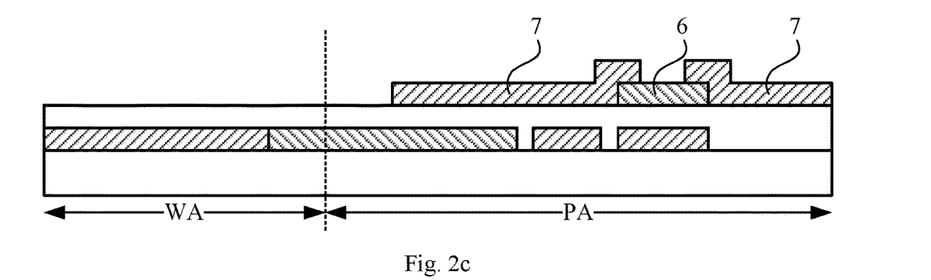
FIG. 2C is a structural diagram of the array substrate of the embodiment shown in FIG. 1 at a stage during fabrication.

As shown in FIG. 2C, an active layer 6 and a source or drain electrode 7 are formed.

Figure 2D:
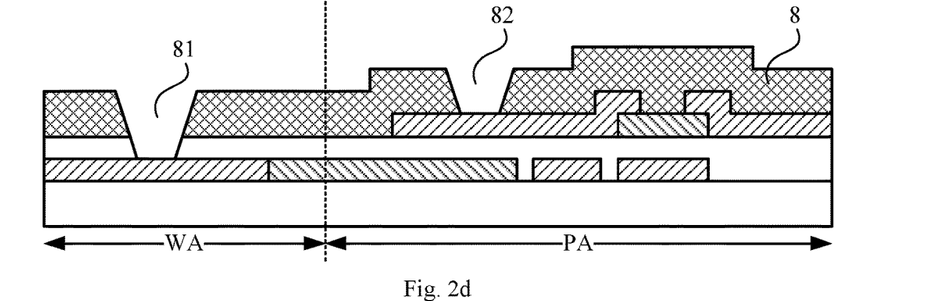
FIG. 2D is a structural diagram of the array substrate of the embodiment shown in FIG. 1 at a stage during fabrication.

As shown in FIG. 2D, a second insulating layer 8 is formed, and a first via 81 and a second via 82 are formed over the data line lead 3W and the source or drain electrode 7, respectively. In the embodiment shown in FIG. 2D, the first via 81 runs through the first insulating layer 5 and the second insulating layer 8, and the second via 82 runs through the second insulating layer 8. In an alternative embodiment, the second insulating layer 8 does not completely cover the first insulating layer 5 over the data line leads 3W. In this case, the first via 81 only runs through the first insulating layer 5.

Figure 2E:
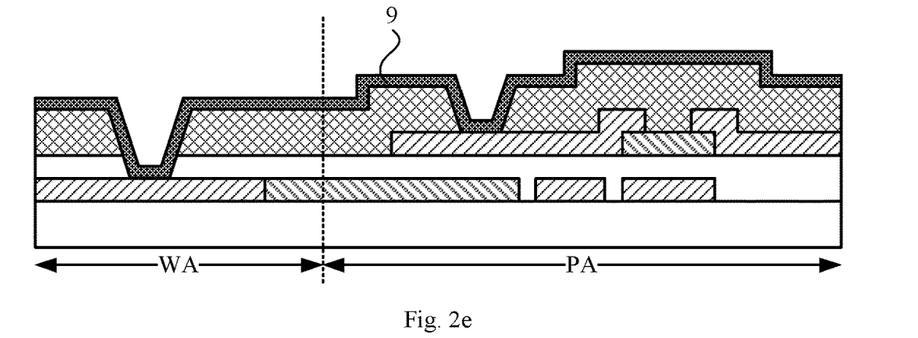
FIG. 2E is a structural diagram of the array substrate of the embodiment shown in FIG. 1 at a stage during fabrication.

Finally, as shown in FIG. 2E, a first conductive layer 9 is formed over the second insulating layer 8, which is electrically connected to the data line leads 3W and the source or drain electrode 7, respectively.

As can be seen from the above-described fabrication method, according to the array substrate of the present embodiment, when electrostatic discharge occurs in the production process and thus an open circuit occurs between the data line lead and the source or drain electrode, repair may be performed by the repairing component, so that a conduction path is formed between the data line lead and the source or drain electrode. In addition, the production process can be simplified and the production cost can be saved.

An array substrate according to another embodiment of the present disclosure will be described below with reference to FIG. 3 and FIGS. 4A-4F. The principle of the array substrate is identical with the embodiment described with reference to FIG. 1 and FIGS. 2A-2E, and the structural differences therebetween are as follows.

Figure 3:
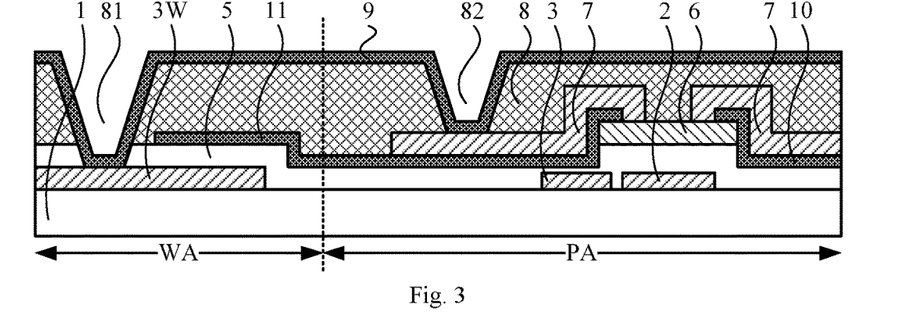
FIG. 3 is a structural schematic diagram of an array substrate according to another embodiment of the present disclosure.

A second conductive layer is further disposed between a layer where the source or drain electrode is located and a layer where the data line lead is located in a direction perpendicular to the substrate. The second conductive layer serves, for example, as a pixel electrode and is located in the pixel region. For example, the material of the second conductive layer is indium tin oxide. Specifically, in a direction perpendicular to the substrate, the second conductive layer is disposed between the layer where the first insulating layer is located and the layer where the source or drain electrode is located, and the second conductive layer is electrically connected to the source or drain electrode and insulated from the data line lead. In this case, the repairing component is electrically connected to the source or drain electrode and overlaps at least a portion of the data line lead. Such a structure can be applied to an array substrate in an ADS (Advanced Super Dimensional Switching) mode or a HADS (High Aperture Advanced Super Dimensional Switching) mode. That is, it can be applied to all array substrates with a common electrode and a pixel electrode.

The array substrate in the HADS mode is taken as an example for description. As shown in FIG. 3, the array substrate comprises a substrate 1, which is made of glass and is divided into a lead region WA and a pixel region PA. The pixel region PA of the substrate 1 is provided with a plurality of thin film transistors, and each thin film transistor comprises a gate electrode 2, an active layer 6, a source or drain electrode 7, and the like. The lead region WA of the substrate 1 is provided with a plurality of data line leads 3W, which are arranged in a same layer as the gate electrode 2 of the thin film transistor, and are respectively used to connect to the source or drain electrode 7 of each corresponding thin film transistor to output its data signal.

In the present embodiment, the data line lead 3W is located in the lead region WA, and the source or drain electrode 7 and the second conductive layer 10 are located in the pixel region PA. The material of the first insulating layer 5 is a non-metal, e.g. silicon nitride. The first insulating layer 5 protects the data line leads 3W and disables direct contact between the data line lead 3W and the source or drain electrode 7 to form an electrically conductive connection. In a direction perpendicular to the substrate 1, the second conductive layer 10 is disposed between the layer where the first insulating layer 5 is located and the layer where the source or drain electrode 7 is located, and is electrically connected to the source or drain electrode 7. Due to the arrangement of the first insulating layer 5, there is a difference in height between the source or drain electrode 7 and the data line lead 3W. The first conductive layer 9 serves for example as a common electrode and its material is indium tin oxide. The first conductive layer 9 may be sized to cover any one of the data line leads 3W and the source or drain electrode 7 of the thin film transistor corresponding to the data line lead 3W.

The material of the second insulating layer 8 is a non-metal, e.g. silicon nitride. The second insulating layer 8 is disposed between the layer where the first conductive layer 9 is located and the layer where the first insulating layer 5 is located to protect the source or drain electrode 7. In an embodiment, as shown in FIG. 3, the second insulating layer 8 completely covers the first insulating layer 5. In an alternative embodiment, the second insulating layer 8 covers only a portion of the first insulating layer 5.

Due to the arrangement of the first insulating layer 5, the layer where the data line lead 3W is located is insulated from the layer where the source or drain electrode 7 is located. Therefore, in order to realize the electrical connection between the data line lead 3W and the source or drain electrode 7, a deep first via 81 may be disposed on the first insulating layer 5, and a shallow second via 82 may be disposed on the second insulating layer 8. The first conductive layer 9 is electrically connected to the data line lead 3W through the first via 81 and electrically connected to the source or drain electrode 7 through the second via 82. Thereby, the first conductive layer 9 realizes the connection between the data line lead 3W and the source or drain electrode 7 through the via, so that a conduction path is formed between the data line lead 3W and the source or drain electrode 7.

It should be noted that, in the structure shown in the drawing, in order to ensure that the first conductive layer 9 can be connected to the data line lead 3W, the first via 81 needs to pass through both the first insulating layer 5 and the second insulating layer 8. However, when the second insulating layer 8 covers only a portion of the first insulating layer 5, the first via 81 only needs to pass through the first insulating layer 5. In the context of the present disclosure, "deep" and "shallow" are only relative results obtained by comparing the depth of the first via 81 with the depth of the second via 82.

Specifically, in the present embodiment, the repairing component may be the conductive portion 11 which is arranged in a same layer as the second conductive layer 10. Therefore, the material of the repairing component is that of the second conductive layer 10. The conductive portion 11 is directly electrically connected to the source or drain electrode 7.

It should be noted that the conductive portion 11 and the second conductive layer 10 are insulated from each other. For example, in an embodiment, an insulating layer is disposed between the second conductive layer 10 and the conductive portion 11 to insulate the conductive portion 11 from the second conductive layer. In an alternative embodiment, a gap is disposed between the second conductive layer 10 and the conductive portion 11, such that the second conductive layer is not connected with the conductive portion 11. The conductive portion 11 extends from the pixel region PA to the lead region WA, and at least partially overlaps the data line lead 3W in an insulated manner. As described above, "the conductive portion at least partially overlaps the data line lead" refers to that "the orthographic projection of the conductive portion on the substrate at least partially overlaps the orthographic projection of the data line lead on the substrate". The size of the specific overlapping portion can be specifically determined according to actual needs or costs, as long as the electrical connection between the data line lead 3W and the conductive portion 11 can be realized by laser welding and the data line lead 3W is electrically connected with the source or drain electrode 7.

FIGS. 4A-4E are schematic cross-sectional views of the array substrate of the present embodiment in specific preparation steps. For example, the method of fabricating the array substrate comprises the following steps.

Figure 4A:
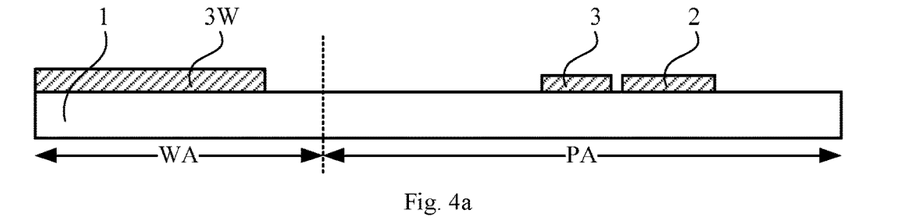
FIG. 4A is a schematic structural diagram of the array substrate of the embodiment shown in FIG. 3 at a stage during fabrication.

As shown in FIG. 4A, a gate electrode 2 and a data line lead 3W are formed on the substrate 1.

Figure 4B:
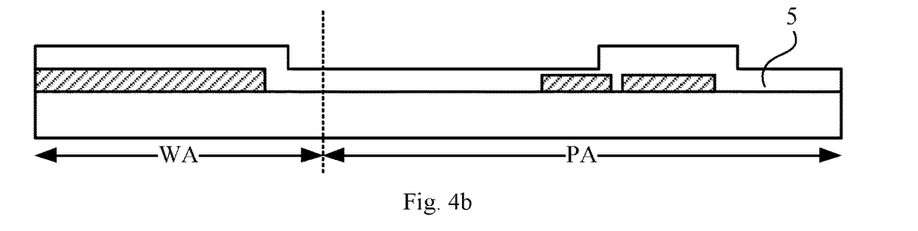
FIG. 4B is a schematic structural diagram of the array substrate of the embodiment shown in FIG. 3 at a stage during fabrication.

As shown in FIG. 4B, a first insulating layer 5 is formed on the substrate 1 on which the gate electrode 2 and the data line lead 3W have been formed.

Figure 4C:
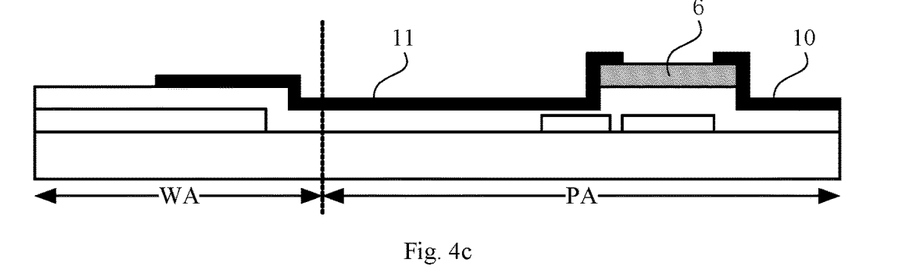
FIG. 4C is a schematic structural diagram of the array substrate of the embodiment shown in FIG. 3 at a stage during fabrication.

As shown in FIG. 4C, an active layer 6, a second conductive layer 10, and a conductive portion 11 are formed. The conductive portion 11 extends from the pixel region PA to the lead region WA.

Figure 4D:
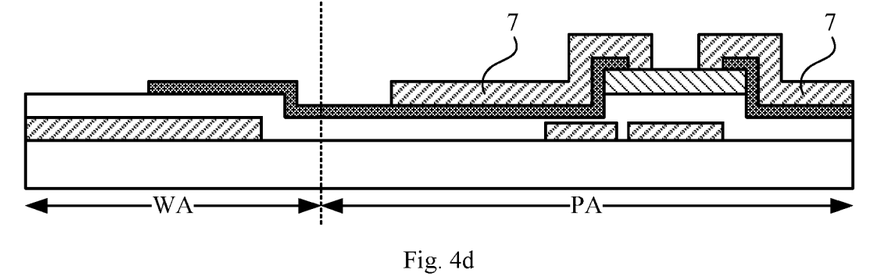
FIG. 4D is a schematic structural diagram of the array substrate of the embodiment shown in FIG. 3 at a stage during fabrication.

As shown in FIG. 4D, a source or drain electrode 7 is formed. The source or drain electrode 7 is directly electrically connected to the conductive portion 11.

Figure 4E:
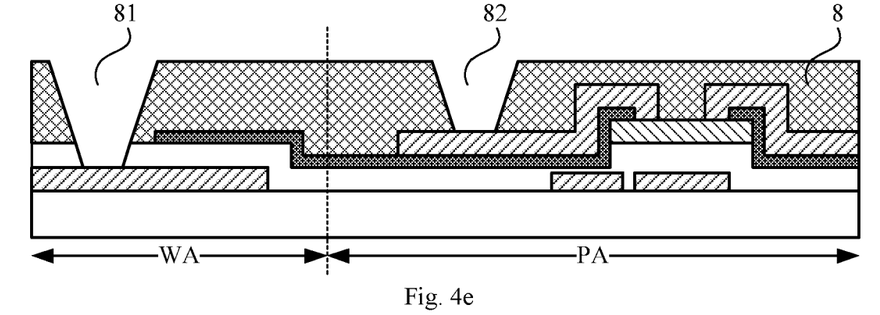
FIG. 4E is a schematic structural diagram of the array substrate of the embodiment shown in FIG. 3 at a stage during fabrication.

As shown in FIG. 4E, a second insulating layer 8 is formed, and a first via 81 and a second via 82 are respectively formed on the first insulating layer 5 and the second insulating layer 8. As shown, the first via 81 is located over the data line lead 3W and runs through the first insulating layer 5 and the second insulating layer 8, and the second via 62 is located over the source or drain electrode 7 and runs through the second insulating layer 8.

Figure 4F:
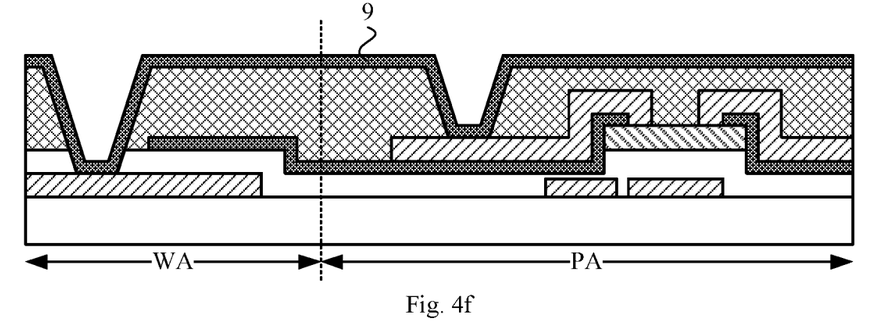
FIG. 4F is a schematic structural diagram of the array substrate of the embodiment shown in FIG. 3 at a stage during fabrication.

Finally, as shown in FIG. 4F, a first conductive layer 9 is formed over the second insulating layer 8, which is electrically connected to the data line leads 3W and the source or drain electrode 7, respectively.

As can be seen from the above production method, in the production process of the array substrate of the embodiment, since the array substrate itself is provided with the second conductive layer, and only the second conductive layer needs to be modified, the production process is compliant with the existing 1+5 Mask process (or 1+4 Mask process). When electrostatic discharge occurs in the production process and thus an open circuit occurs between the data line lead and the source or drain electrode, repair may be performed by the repairing component, so that a conduction path is formed between the data line lead and the source or drain electrode. In addition, the production process can be simplified and the production cost can be saved.

The repairing method of the array substrate of the embodiment of the present disclosure can be applied to any array substrate in the embodiment shown with reference to FIG. 1 and FIGS. 2A-2E or the embodiment shown in FIG. 3. When the first conductive layer connecting the data line lead and the source or drain electrode surfers from an open circuit, the repairing component is electrically connected, by laser welding, to the data line lead or the source or drain electrode which overlap the repairing component in an insulated manner, and a conduction path is thereby formed between the data line lead and the source or drain electrode by the repairing component.

Therefore, when electrostatic discharge occurs in the production process and thus an open circuit occurs between the data line lead and the source or drain electrode, the repairing method of the embodiments of the present disclosure can enable the repair to be performed by the repairing component, so that a conduction path is formed between the data line lead and the source or drain electrode. Thereby, the array substrate can be repaired and the production yield of the array substrate is improved.

The present disclosure also provides a display device comprising any one array substrate in the embodiment described with reference to FIG. 1 and FIGS. 2A-2E or the embodiment described with reference to FIG. 3 and FIGS. 4A-4F. A repairing component is disposed on the array substrate. The repairing component comprises a conductive material. The repairing component is electrically connected to one of the data line lead and the source or drain electrode, and at least partially overlaps the other of the data line lead and the source or drain electrode in an insulated manner.

The display device of the embodiments of the present disclosure may be any product or component having a display function such as a liquid crystal panel, an electronic paper, an OLED panel, a mobile phone, a tablet computer, a television, a display, a notebook computer, a digital photo frame, a navigator, and the like.

When electrostatic discharge occurs in the production process and thus an open circuit occurs between the data line lead and the source or drain electrode, the display device of the embodiments of the present disclosure can enable the repair to be performed by the repairing component, so that a conduction path is formed between the data line lead and the source or drain electrode, thereby improving the production yield of the array substrate and reducing the production cost.

Embodiments of the present disclosure provide an array substrate, a repair method thereof, and a display device. The array substrate comprises: a substrate comprising a first electrode and a second electrode, wherein the first electrode and the second electrode are located in different layers, and a projection of the first electrode on the substrate does not overlap a projection of the second electrode on the substrate, the first conductive layer electrically connecting the first electrode and the second electrode through vias; and a repairing component configured to electrically connect the first electrode and the second electrode when the electrical connection between the first electrode and the second electrode fails. Specifically, taking the first electrode being a data line lead and the second electrode being a source or drain electrode as an example, by providing a repairing component, the repairing component is electrically connected to one of the data line lead and the source or drain electrode and at least partially overlaps the other of the data line lead and the source or drain electrode in an insulated manner. When electrostatic discharge occurs in the production process of the array substrate and electrical connection failure such as open circuit thus occurs between the data line lead and the source or drain electrode, the electrical connection between the data line lead and the source or drain electrode can be restored by repair, thereby improving the production yield of the array substrate and saving the production cost.

The above is only a schematic description of the present disclosure, and those skilled in the art should understand that various modifications can be made to the present disclosure without departing from the principle of the present disclosure. All of these fall within the protection scope of the present disclosure.

What is claimed is:

1. An array substrate, comprising:
   a substrate comprising a first electrode and a second electrode, wherein the first electrode and the second electrode are located in different layers, and a projection of the first electrode on the substrate does not overlap a projection of the second electrode on the substrate;
   a first conductive layer electrically connecting the first electrode and the second electrode through vias; and
   a repairing component configured to electrically connect the first electrode and the second electrode when an electrical connection between the first electrode and the second electrode fails,
   wherein the repairing component is a first electrode extension formed by extending from the first electrode, and
   wherein the first electrode extension is insulated from the second electrode, and a projection of the first electrode extension on the substrate overlaps the projection of the second electrode on the substrate.

2. An array substrate comprising:
a substrate comprising a first electrode and a second electrode, wherein the first electrode and the second electrode are located in different layers, and a projection of the first electrode on the substrate does not overlap a projection of the second electrode on the substrate,
a first conductive layer electrically connecting the first electrode and the second electrode through vias; and
a repairing component configured to electrically connect the first electrode and the second electrode when an electrical connection between the first electrode and the second electrode fails,
wherein the repairing component is a conductive portion electrically connected to the second electrode, and
wherein the conductive portion is insulated from the first electrode, and a projection of the conductive portion on the substrate overlaps the projection of the first electrode on the substrate.

3. The array substrate of claim 1, wherein the substrate comprises a lead region and a pixel region, the first electrode is located in the lead region, and the second electrode is located in the pixel region.

4. The array substrate of claim 2, wherein the substrate comprises a lead region and a pixel region, the first electrode is located in the lead region, and the second electrode is located in the pixel region.

5. A method of repairing the array substrate of claim 2, comprising: electrically connecting the first electrode and the second electrode with the repairing component when the electrical connection between the first electrode and the second electrode fails.

6. An array substrate, comprising:
a substrate comprising a first electrode and a second electrode, wherein the first electrode and the second electrode are located in different layers, and a projection of the first electrode on the substrate does not overlap a projection of the second electrode on the substrate;
a first conductive layer electrically connecting the first electrode and the second through a vias; and
a repairing component configured to electrically connect the first electrode and the second electrode when an electrical connection between the first electrode and the second electrode fails,
wherein the substrate comprises a lead region and a pixel region, the first electrode is located in the lead region, and the second electrode is located in the pixel region.

7. The array substrate of claim 6, wherein the pixel region is provided with a plurality of thin film transistors and a plurality of data lines, the lead region is provided with a plurality of data line leads, the plurality of data lines are electrically connected with the plurality of data line leads in one-to-one correspondence, the data lines are arranged in a same layer as gate electrodes of the thin film transistors, the first electrode is the plurality of data line leads, and the second electrode is source or drain electrodes of the thin film transistors; and
wherein the repairing component is electrically connected to one of the data line leads and the source or drain electrode, and at least partially overlaps the remainder of the data line leads and the source or drain electrode in an insulated manner.

8. The array substrate of claim 7, wherein the repairing component is a data line lead extension which protrudes from the data line lead toward the source or drain electrode, the data line lead extension extends to the pixel region and at least partially overlaps the source or drain electrode in an insulated manner.

9. The array substrate of claim 8, wherein a projection of the source or drain electrode on the substrate falls within a projection of the data line lead extension on the substrate.

10. The array substrate of claim 7, further comprising a second conductive layer located in the pixel region, wherein the second conductive layer is disposed between a layer where the source or drain electrode of the thin film transistor is located and a layer where the gate electrode is located in a direction perpendicular to the substrate, and the second conductive layer is electrically connected to the source or drain electrode and insulated from the data line lead.

11. The array substrate of claim 10, wherein the repairing component is a conductive portion which is arranged in a same layer as the second conductive layer, and the conductive portion is directly electrically connected to the source or drain electrode.

12. The array substrate of claim 11, wherein the conductive portion is insulated from the second conductive layer, extends from the pixel region to the lead region, and at least partially overlaps the data line lead in an insulated manner.

13. The array substrate of claim 12, wherein the projection of the source or drain electrode on the substrate falls within the projection of the conductive portion on the substrate.

14. The array substrate of claim 7, further comprising
a first insulating layer, wherein the first insulating layer is disposed between the data line lead and the source or drain electrode,
a first via is disposed on the first insulating layer, and
the first conductive layer is electrically connected to the data line lead through the first via.

15. The array substrate of claim 14, further comprising
a second insulating layer, wherein the second insulating layer is disposed between the first conductive layer and the source or drain electrode,
a second via is disposed on the second insulating layer, and
the first conductive layer is electrically connected to the source or drain electrode through the second via.

16. The array substrate of claim 15, wherein the first via runs through the first insulating layer and the second insulating layer.

17. A display device, comprising the array substrate of claim 1.

18. A method of repairing the array substrate of claim 1, comprising: electrically connecting the first electrode and the second electrode with the repairing component when the electrical connection between the first electrode and the second electrode fails.

19. The method of claim 18, comprising: electrically connecting the repairing component to one of the first electrode and the second electrode by laser welding.

20. The array substrate of claim 7, wherein the data lines and data line leads are formed of a metal.

* * * * *